United States Patent
Han et al.

(10) Patent No.: US 7,562,923 B2
(45) Date of Patent: Jul. 21, 2009

(54) TRAY TRANSFERRING APPARATUS WITH GRIPPER MECHANISM

(75) Inventors: Jung Ug Han, Chungchungnam-do (KR); Woo Young Lim, Seoul (KR); Ho Keun Song, Kyungki-do (KR); Young Geun Park, Kyungki-do (KR)

(73) Assignee: Mirae Corporation, Chunan-si (KR)

( * ) Notice: Subject to any disclaimer, the term of this patent is extended or adjusted under 35 U.S.C. 154(b) by 414 days.

(21) Appl. No.: 10/773,325

(22) Filed: Feb. 9, 2004

(65) Prior Publication Data

US 2005/0173446 A1    Aug. 11, 2005

(51) Int. Cl.
*B25J 15/08* (2006.01)
(52) U.S. Cl. .................. 294/119.1; 294/902; 294/907
(58) Field of Classification Search ............. 294/119.1, 294/88, 901, 902, 907; 414/274, 282
See application file for complete search history.

(56) References Cited

U.S. PATENT DOCUMENTS

| | | | | |
|---|---|---|---|---|
| 4,453,757 A | * | 6/1984 | Soraoka | 294/119.1 |
| 4,750,132 A | * | 6/1988 | Pessina et al. | 414/751.1 |
| 5,391,050 A | * | 2/1995 | Gatteschi | 414/796 |
| 5,762,391 A | * | 6/1998 | Sumnitsch | 294/119.1 |
| 6,138,909 A | * | 10/2000 | Rockwell et al. | 29/704 |
| 6,334,641 B1 | * | 1/2002 | Oh | 294/119.1 |
| 6,354,792 B1 | * | 3/2002 | Kobayashi et al. | 414/796.7 |
| 6,379,103 B1 | * | 4/2002 | Okugi | 414/627 |
| 6,406,246 B1 | * | 6/2002 | Itoh et al. | 414/274 |
| 6,547,296 B1 | * | 4/2003 | Perkitny et al. | 294/16 |
| 2003/0178866 A1 | * | 9/2003 | Chae et al. | 294/119.1 |

FOREIGN PATENT DOCUMENTS

JP         3-178792      *   8/1991

* cited by examiner

*Primary Examiner*—Paul T Chin
(74) *Attorney, Agent, or Firm*—KED & Associates, LLP

(57) ABSTRACT

A tray transferring apparatus for transferring a handling tray on which semiconductor devices are mounted prevents the semiconductor devices from being scattered or separated from the handling tray. The tray transferring apparatus includes a fixing means installed on a main frame for supporting a fixed tray, a correcting means installed on the main frame for correcting the position of the fixed tray, a gripping means installed on the main frame for gripping a handling tray, and at least one sensor for sensing gripper plates and the handling tray. A fixed tray is held by the fixing means, and right/left inclination of the fixed tray is corrected by the correcting means. An upper portion of a handling tray holding semiconductors is covered by the bottom of the fixed tray and is gripped by the gripping means.

23 Claims, 9 Drawing Sheets

< Prior Art >

TRAY TRANSFERRING APPARATUS WITH GRIPPER MECHANISM

BACKGROUND OF THE INVENTION

1. Field of the Invention

The present invention relates to a tray transferring apparatus, and more particularly to, an improved tray transferring apparatus which can stably transfer semiconductor devices not separately from a handling tray during the transferring operation of the handling tray, by gripping a fixed tray by a first fixing member, correcting right/left inclination of the clamped fixed tray by a correcting means, and covering the upper portion of the handling tray with the clamped fixed tray.

2. Description of the Background Art

In general, tests for detecting defects are executed on semiconductor devices completed on production lines before forwarding. A horizontal handler is used to test various logic devices, such as quad flat packages (QFP), ball grid arrays (BGA), pin grid arrays (PGA) and small outline packages (SOP) which are non-memory semiconductor packages among the semiconductor devices.

The horizontal handler automatically horizontally moves the devices on a tray between the processes, mounts the devices on a horizontally-disposed test socket of a test site, executes a wanted test thereon, classifies the devices into various levels according to the test results, and unloads the devices on the tray.

On the other hand, recently, there have been increasing demands for the semiconductor devices stably operated in a specific temperature environment such as a high or low temperature as well as a normal temperature. Accordingly, the horizontal handler is also required to test performance of the semiconductor devices in a wanted temperature of users.

In order to test the semiconductor devices in the high or low temperature, the tray on which the semiconductor devices are mounted needs to be stably transferred.

In the case that small-sized semiconductor devices are transferred by a handling tray to be tested in the handler, the semiconductor devices are frequently scattered or bounced from the handling tray.

It results from the small size (light weight) of the semiconductor devices.

A conventional tray transferring apparatus has been disclosed under Korean Laid-Open Patent Registration 10-0381854.

The conventional tray transferring apparatus for transferring the tray in the handler will now be explained with reference to FIG. 1.

FIG. 1 is a schematic perspective view illustrating the conventional tray transferring apparatus.

Referring to FIG. 1, a base plate 10 is moved in the X axis direction by rotation of a ball screw 11 installed on the base plate 10 in the X axis direction, and two sheets of first and second support plates 20 and 30 are installed through linear guides 12 extended in the Z axis direction on one surface of the base plate 10.

Here, the first and second support plates 20 and 30 are moved in the Z axis direction by driving of first and second cylinders 21 and 31 positioned below them. A plurality of guide pins 22 are appropriately disposed on the edges of the upper portion of the first support plate 30, thereby guiding the edges of the tray 1 to be stably mounted on the first support plate 20.

In addition, hooks 32 are disposed in the edges of the lower portion of the second support plate 30 to clamp the tray 1.

A hook apparatus 33 connected to the upper portions of the hooks 32 of the second support plate 30 rotates the hooks 32 to the inside/outside of the second support plate 30. A cylinder 34 connected to one end of the hook apparatus 33 drives the hook apparatus 33.

The hook apparatus 33 includes an H-shaped frame 33a, four pins 33b installed to face each other in both ends of the frame 33a, and four shafts 33c rotatably connected to each pin 33b. The hooks 32 are rotated in the forward/backward direction by the hook apparatus 33, to clamp/release the tray 1.

The first and second support plates 20 and 30 sense existence/absence of the tray 1 by proximity sensors 23 and 35 disposed in the outsides thereof.

The conventional tray transferring apparatus can transfer the empty tray 1 by using the first support plate 20, and the tray 1 on which electronic components (not shown) are mounted by using the second support plate 30.

The second support plate of the conventional tray transferring apparatus uses the hooks rotated by the hook apparatus to clamp the tray. However, the hooks do not precisely support the whole tray but support the bottom surface of the tray. Accordingly, when the tray is transferred, the position of the tray is changed by shaking of the apparatus. As a result, a pickup apparatus for picking up the electronic components cannot precisely pick up the electronic components.

In addition, the conventional tray transferring apparatus transfers the tray on which the electronic components are mounted and the empty tray in the clamped and mounted states at the same time. Therefore, the conventional tray transferring apparatus is not easily installed due to the complicated structure. A weight of the apparatus also increases.

Furthermore, the conventional tray transferring apparatus uses many components for transferring the tray, which increases manufacturing expenses.

SUMMARY OF THE INVENTION

The present invention is achieved to solve the above problems. Accordingly, it is an object of the present invention to provide a tray transferring apparatus which can prevent semiconductor devices mounted on a handling tray from being scattered or separated during the transferring operation of the handling tray by the transferring apparatus, by gripping a fixed tray by first and second fixing members, correcting right/left inclination of the clamped fixed tray by a correcting means, and covering the upper portion of the handling tray.

In order to achieve the above-described object of the invention, there is provided a tray transferring apparatus for transferring a tray on which electronic components are mounted, the tray transferring apparatus including: a main frame; a fixing means installed in one side of the main frame, for supporting a fixed tray; a correcting means installed in the lower portion of the main frame, for correcting the fixed tray supported by the fixing means; a gripping means installed in the upper portion of the main frame, for gripping a handling tray; and at least one sensor installed on the main frame, for sensing gripper plates and the handling tray.

The fixing means includes: a first fixing unit installed in one side of the main frame, for supporting one end of the fixed tray; and a second fixing unit installed in the other side of the main frame, for supporting the other end of the fixed tray.

The first fixing unit includes: a pin installed in one side of the main frame; a tension spring having its one end installed on the pin; a first fixing member installed in the other end of the tension spring, for elastically directly gripping one end of the fixed tray, a slot being formed inside the first fixing member; and a slide member installed to be slidable into the slot, for guiding the moved first fixing member.

A hooking jaw is formed in one end of the first fixing member, so that the fixed tray can be hooked and clamped thereon.

The second fixing unit includes: a second fixing member installed in the other side of a base frame, for directly supporting the other end of the fixed tray; and a fastening member for installing the second fixing member on the base frame.

The second fixing member is formed in a 'ㄴ' shape.

At least one correcting means is installed in the center of the main frame, for supporting the fixed tray.

The correcting means includes: a plate installed in the upper portion of the base frame; a compression spring installed in the lower portion of the plate; a spacer installed in the lower portion of the compression spring, for elastically directly correcting the fixed tray by elasticity of the compression spring; and a fastening member for coupling and installing the plate, the compression spring and the spacer on the base frame.

The gripping means includes: a gripping unit for gripping the handling tray; a driving unit for driving the gripping unit; and a guide unit for guiding the gripping unit.

The gripping unit includes: a plurality of grippers for gripping the handling tray; and a plurality of gripper plates on which the grippers are installed, the gripper plates moving the grippers.

The plurality of grippers disposed in the right side and the plurality of grippers disposed in the left side are installed in the right and left sides of the main frame to face each other, for gripping the right and left ends of the handling tray at the same time.

The plurality of gripper plates disposed in the right side of the base frame and the plurality of gripper plates disposed in the left side of the base frame are installed to face each other, the grippers disposed in the right side of the base frame being installed on the gripper plates disposed in the right side of the base frame, the grippers disposed in the left side of the base frame being installed on the gripper plates disposed in the left side of the base frame.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

A tray transferring apparatus in accordance with a preferred embodiment of the present invention will now be described in detail with reference to the accompanying drawings.

Figure 1:
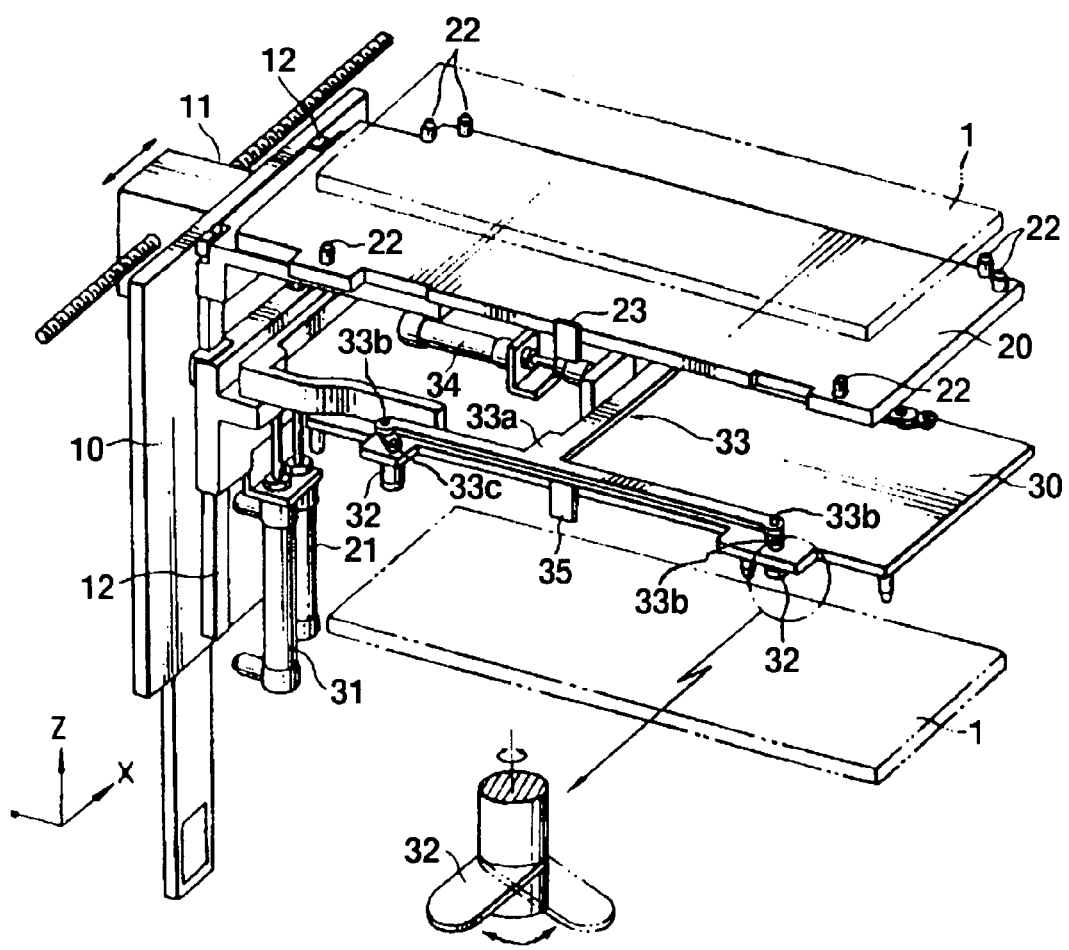
FIG. 1 is a schematic perspective view illustrating a conventional tray transferring apparatus.
Figure 2:
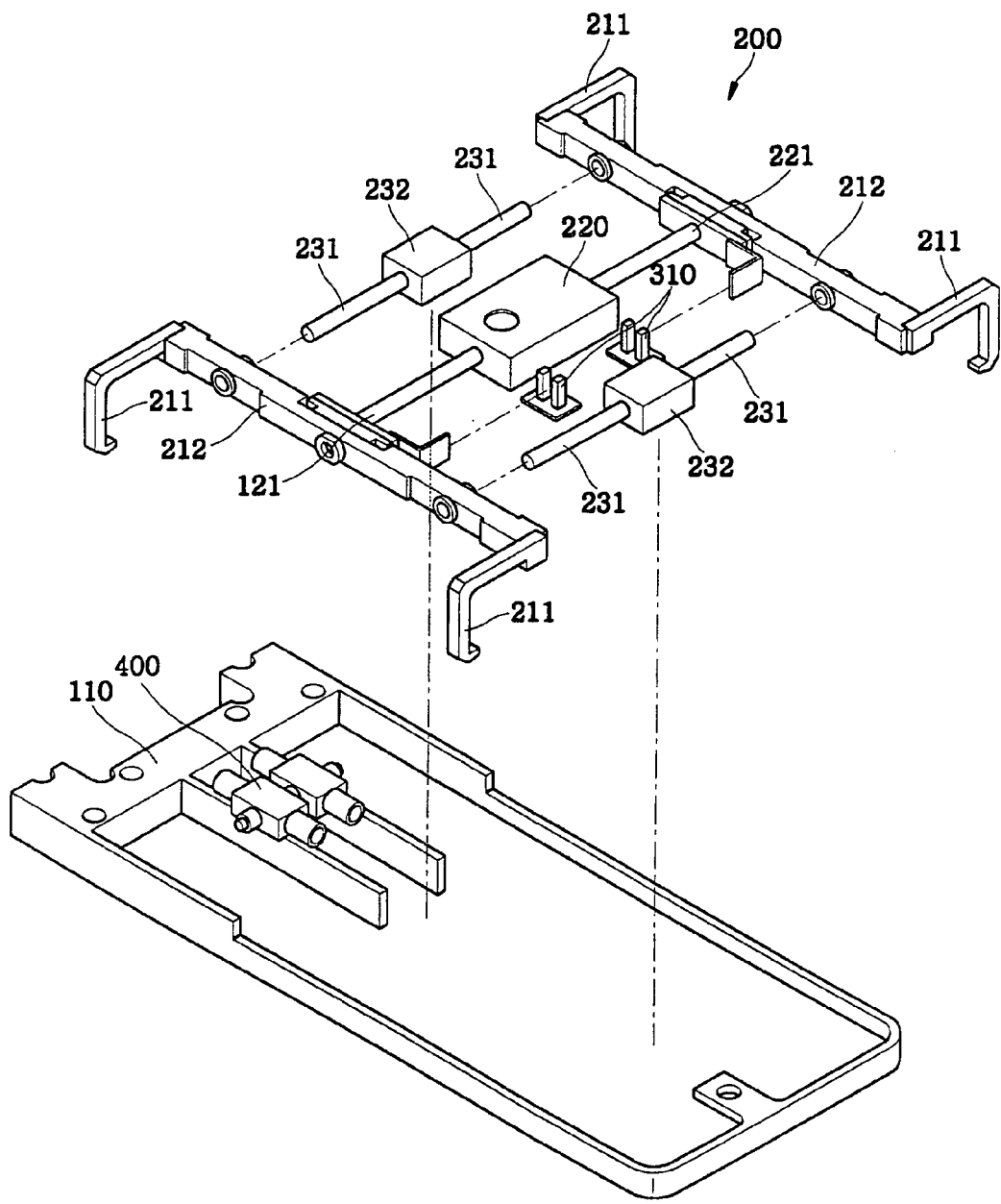
FIG. 2 is a perspective view illustrating a disassembled state of a gripping unit of a tray transferring apparatus in accordance with the present invention.
Figure 3:
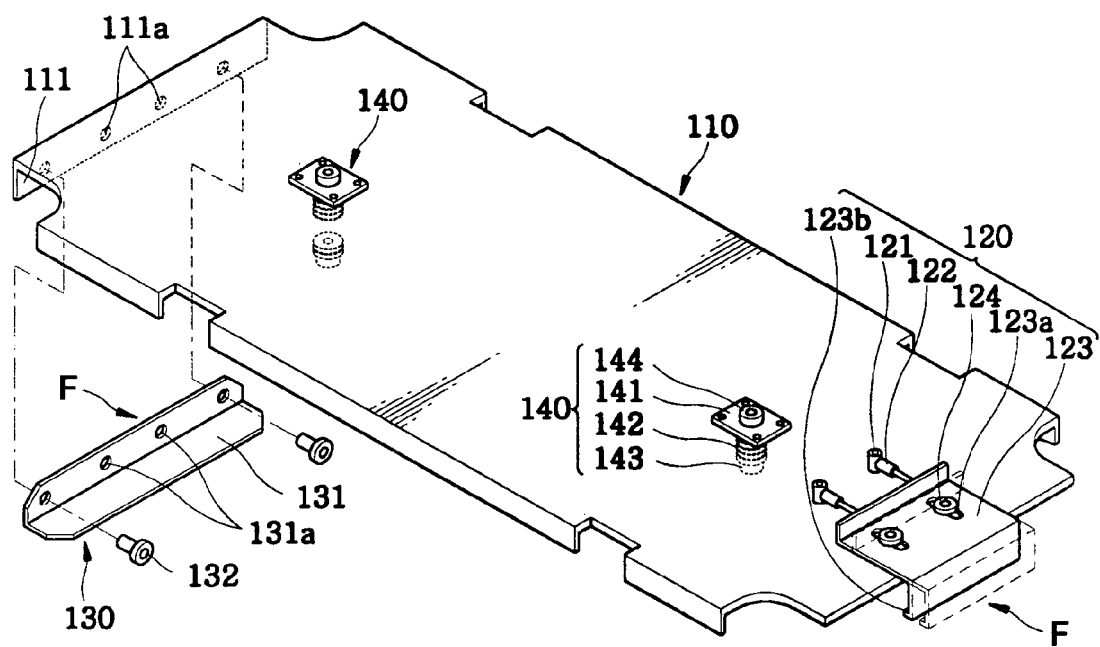
FIG. 3 is a perspective view illustrating first and second fixing units of a fixing means of the tray transferring apparatus.

FIG. 2 is a perspective view illustrating a disassembled state of a gripping unit of the tray transferring apparatus in accordance with the present invention, and FIG. 3 is a perspective view illustrating first and second fixing units of a fixing means of the tray transferring apparatus.

Figure 4A:
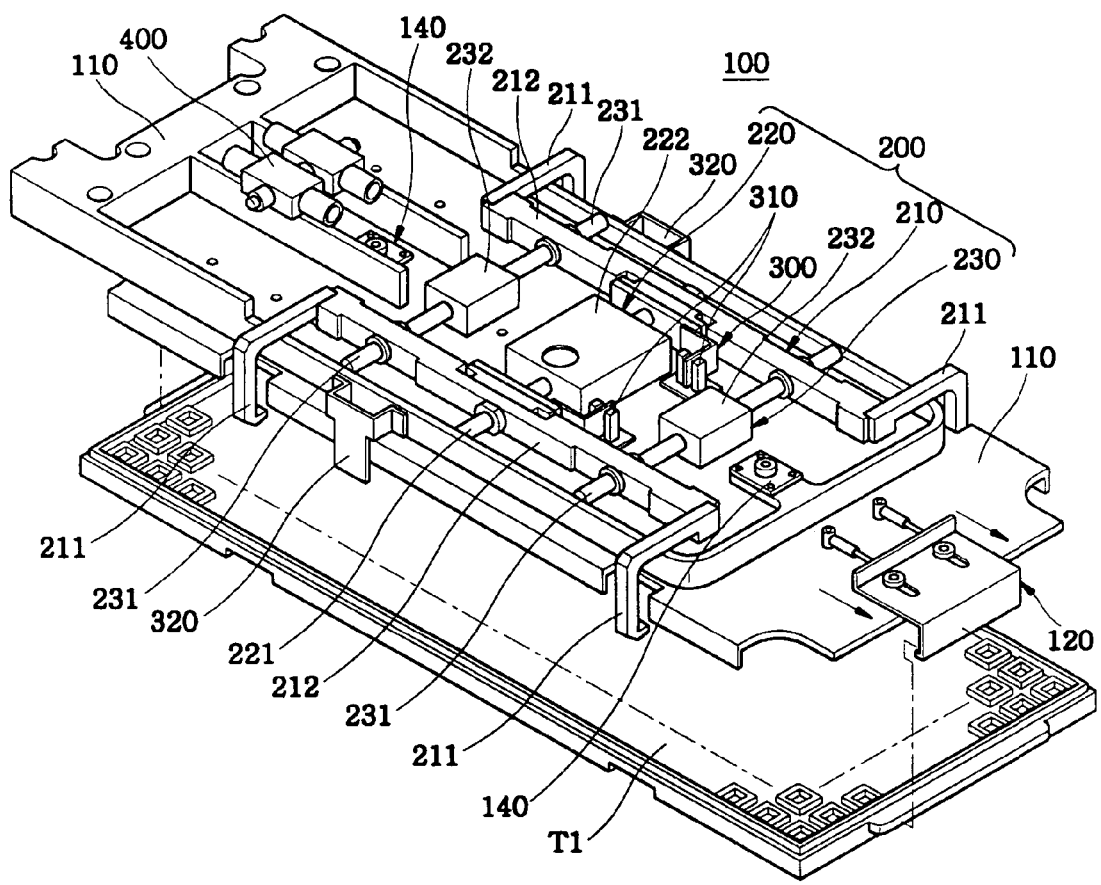
FIG. 4a is a perspective view illustrating a state where a fixed tray is fixed to the first and second fixing units of the tray transferring apparatus.
Figure 4B:
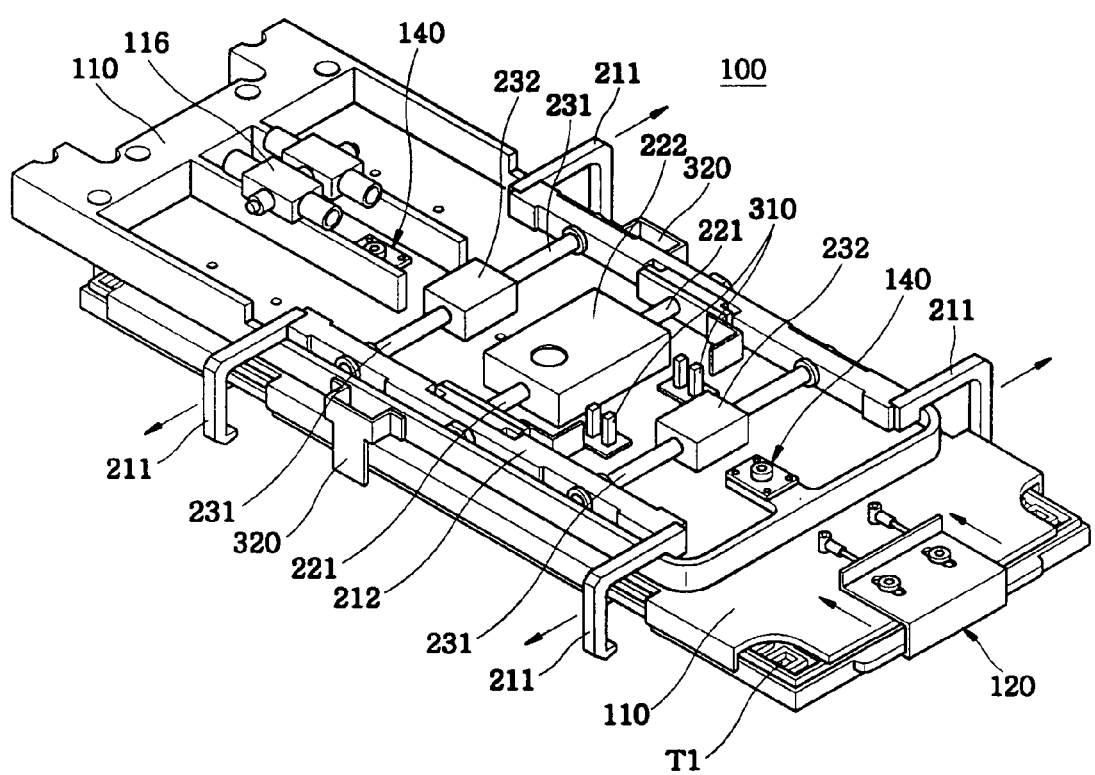
FIG. 4b is a perspective view illustrating a state where the fixed tray is fixed to the first and second fixing units and grippers are opened in the tray transferring apparatus.
Figure 4C:
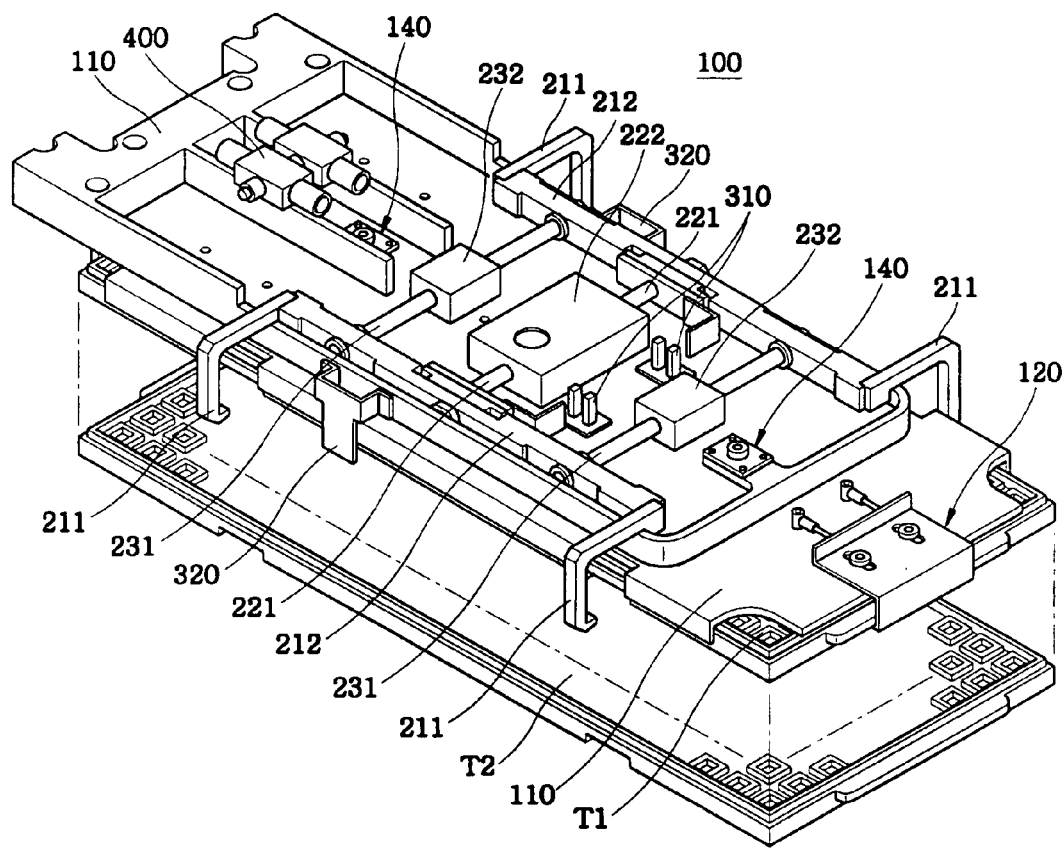
FIG. 4c is a perspective view illustrating a state where a handling tray is clamped by the opened grippers of the tray transferring apparatus.
Figure 4D:
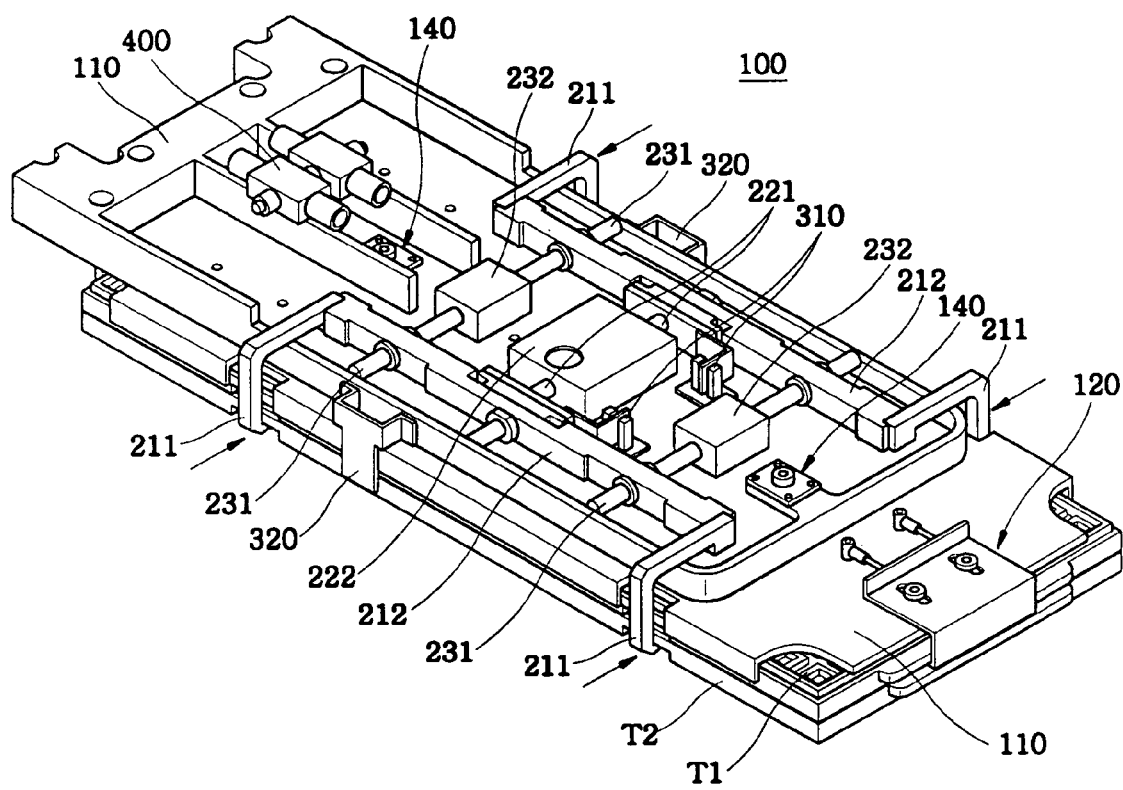
FIG. 4d is a perspective view illustrating a state where the handling tray is clamped by the closed grippers of the tray transferring apparatus.

FIG. 4a is a perspective view illustrating a state where a fixed tray is fixed to the first and second fixing units of the tray transferring apparatus, FIG. 4b is a perspective view illustrating a state where the fixed tray is fixed to the first and second fixing units and grippers are opened in the tray transferring apparatus, FIG. 4c is a perspective view illustrating a state where a handling tray is clamped by the opened grippers of the tray transferring apparatus, and FIG. 4d is a perspective view illustrating a state where the handling tray is clamped by the closed grippers of the tray transferring apparatus.

Figure 5A:
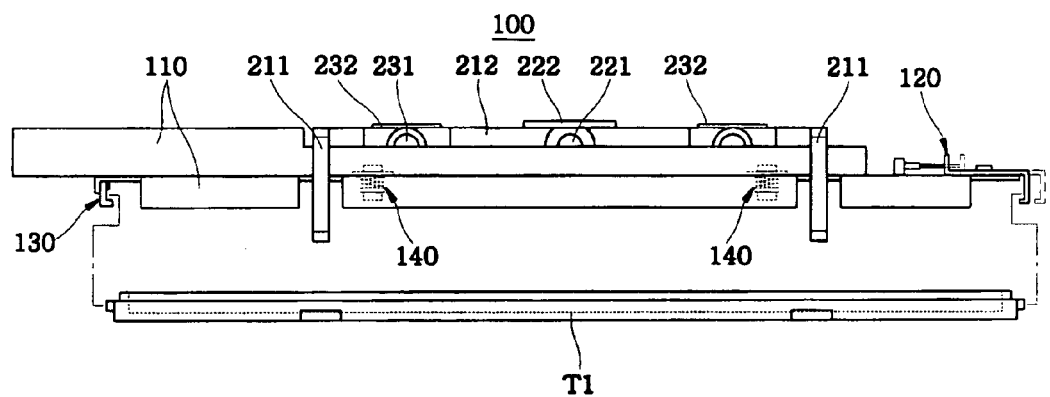
FIG. 5a is a left side view illustrating a state where the fixed tray is fixed to the first and second fixing units of the tray transferring apparatus.
Figure 5B:
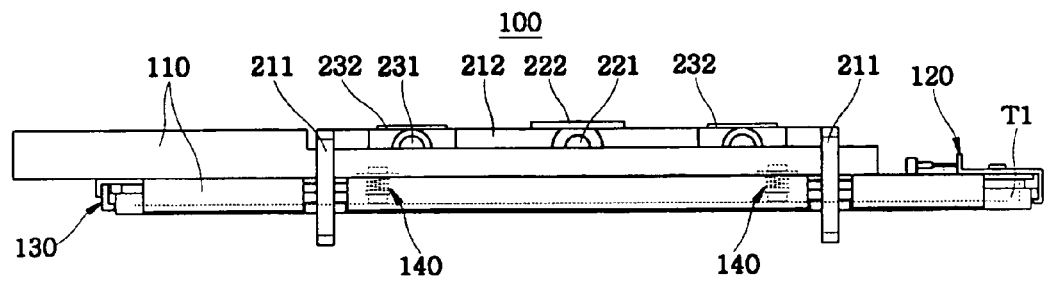
FIG. 5b is a left side view illustrating a fixed state of the fixed tray to the first and second fixing units of the tray transferring apparatus.

FIG. 5a is a left side view illustrating a state where the fixed tray is fixed to the first and second fixing units of the tray transferring apparatus, and FIG. 5b is a left side view illustrating a fixed state of the fixed tray to the first and second fixing units of the tray transferring apparatus.

Figure 6A:
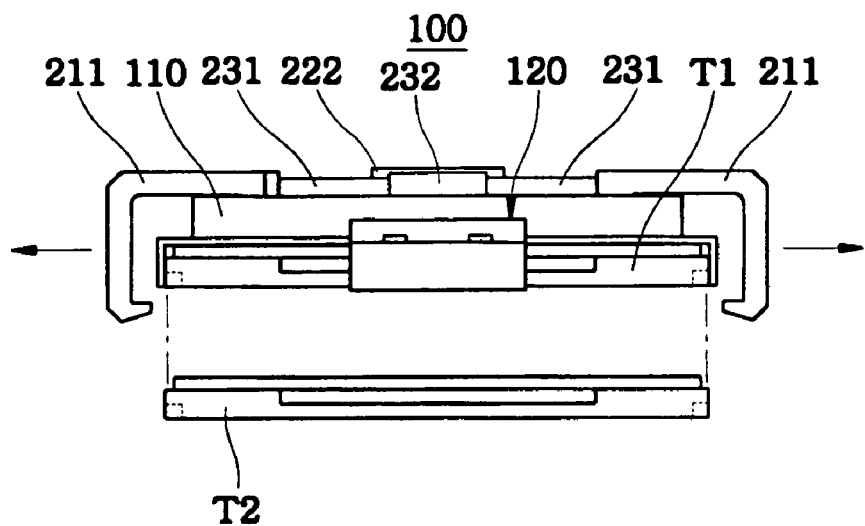
FIG. 6a is a front view illustrating a state where the handling tray is clamped by the opened grippers of the tray transferring apparatus.
Figure 6B:
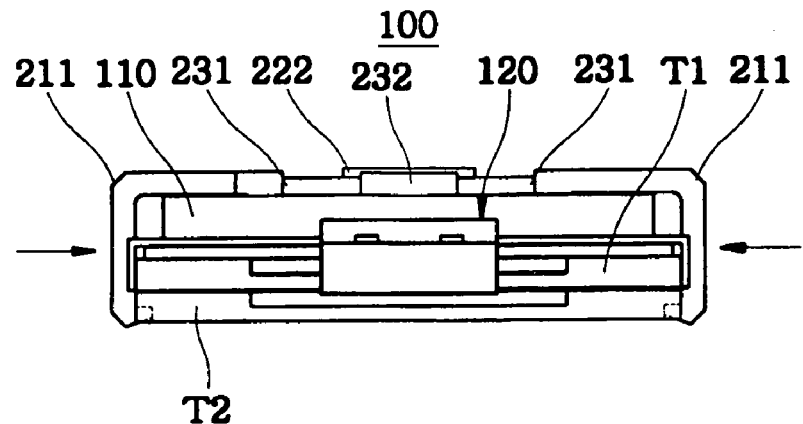
FIG. 6b is a front view illustrating a state where the handling tray is clamped by the closed grippers of the tray transferring apparatus.

FIG. 6a is a front view illustrating a state where the handling tray is clamped by the opened grippers of the tray transferring apparatus, and FIG. 6b is a front view illustrating a state where the handling tray is clamped by the closed grippers of the tray transferring apparatus.

As illustrated in FIGS. 2 to 6b, a tray transferring apparatus 100 includes a main frame 110, a fixing means F installed in the upper portion of the main frame 110, for supporting and fixing a fixed tray T1, a correcting means 140 for correcting the fixed tray T1 fixed by the fixing means F, a gripping means 200 installed in the upper portion of the main frame 110, for gripping a handling tray T2 and adhering the handling tray T2 to the lower portion of the fixed tray T1, and a sensor 300 for sensing the gripping means 200 and the handling tray T2 clamped by the gripping means 200.

A short jaw unit 111 is formed in one end of the main frame 110, and a fastening groove 111a is formed on the short jaw unit 111.

The fastening means F includes a first fixing unit 120 installed in one side of the main frame 110, for supporting one end of the fixed tray T1, and a second fixing unit 130 installed in the other side of the main frame 110, for supporting the other end of the fixed tray T1.

The first fixing unit 120 includes a pin 121 installed in one side of the main frame 110, a tension spring 122 having its one end installed on the pin 121, a first fixing member 123 installed in the other end of the tension spring 122, for elastically directly gripping one end of the fixed tray T1, a slot 123a being formed inside the first fixing member 123, and a slide member 124 installed to be slidable into the slot 123a, for guiding the moved first fixing member 123.

A hooking jaw 123b is formed in one end of the first fixing member 123, so that the fixed tray T1 can be hooked and clamped thereon. Accordingly, one end of the fixed tray T1 can be stably supported and fixed.

The second fixing unit 130 includes a second fixing member 131 installed in the other side of a base frame 110, for directly supporting the other end of the fixed tray T1, and a fastening member 132 for installing the second fixing member 131 on the base frame 110.

The second fixing unit 130 is coupled to the fastening groove 111a formed on the short jaw unit 111 of the main frame 110 by the fastening member 132, and thus installed on the short jaw unit 111.

The second fixing member 131 is formed in a '⌐' shape, to stably support and fix the other end of the fixed tray T1.

At least one correcting means 140 is installed in the center of the main frame 110, for supporting the fixed tray T1 and correcting right/left inclination of the fixed tray T1.

The correcting means 140 includes a plate 141 installed in the upper portion of the base frame 110, a compression spring 142 installed in the lower portion of the plate 141, a spacer 143 installed in the lower portion of the compression spring 142, for elastically directly correcting the fixed tray T1 by elasticity of the compression spring 142, and a fastening member 144 for coupling and installing the plate 141, the compression spring 142 and the spacer 143 on the base frame 110.

The gripping means 200 includes a gripping unit 210 for gripping the handling tray T2, a driving unit 220 for driving the gripping unit 210, and a guide unit 230 for guiding the gripping unit 210.

The gripping unit 210 includes a plurality of grippers 211 for gripping the handling tray T2, and a plurality of gripper plates 212 on which the grippers 211 are installed. Here, the gripper plates 212 move the grippers 211.

The plurality of grippers 211 disposed in the right side and the plurality of grippers 211 disposed in the left side are installed in the right and left sides of the main frame 110 to face each other, for gripping the right and left ends of the handling tray T2 at the same time.

The plurality of gripper plates 212 disposed in the right side of the base frame 110 and the plurality of gripper plates 212 disposed in the left side of the base frame 110 are installed to face each other. Here, the grippers 211 disposed in the right side of the base frame 110 are installed on the gripper plates 212 disposed in the right side of the base frame 110, and the grippers disposed in the left side of the base frame 110 are installed on the gripper plates 212 disposed in the left side of the base frame 110.

The driving unit 220 includes a ball screw 221 for moving the gripping unit 210, and a cylinder 222 for driving the ball screw 221.

The plurality of ball screws 221 are installed in the right and left sides of the cylinder 222 to be symmetric to each other, and rotated in the same direction by driving of the cylinder 222.

Here, spirals (not shown) formed on the outer circumferences of each ball screw 221 are symmetric to each other, and thus the ball screws 221 are rotated in the same direction, so that the gripper plates 212 installed and moved on the ball screws 221 can be opened or closed.

The guide unit 230 includes a rod 231 for moving the gripper plate 212 of the gripping unit 210, and a guide block 232 for guiding the rod 231. The gripper plate 212 can be horizontally moved along the rod 231.

The sensor 300 is an optical sensor. At least one optical sensor 300 is installed, and comprised of first and second optical sensors 310 and 320.

The first optical sensor 310 is installed in the upper portion of the main frame 110, for sensing the gripper plate 212. Here, the plurality of first optical sensors 310 are installed to sense the plurality of gripper plates 212 at the same time. The second optical sensors 320 are installed in both sides of the main frame 110, for sensing existence/absence of the handling tray T2.

A speed control valve 400 for controlling a volume of compressed air and supplying compressed air to the cylinder 222 is installed in one side of the main frame 110.

In accordance with the present invention, the tray transferring apparatus 100 can be applied to stackers (not shown) for stacking the handling trays T2 on which the semiconductor devices are mounted in the general handler.

The structure and operation of the tray transferring apparatus 100 will now be described in more detail.

The tray transferring apparatus 100 is installed to load or unload the handling trays T2 to/from the plurality of stackers of the handler.

Here, the fixed tray T1 is fixed to the first and second fixing units 120 and 130 of the fixing means F installed on the main frame 110 of the tray transferring apparatus 100. One end of the fixed tray T1 is inserted into the second fixing unit 130, and the other end thereof is inserted into the first fixing unit 120.

The second fixing unit 130 is formed in a '⌐' shape, and the hooking jaw 123b is formed in one end of the first fixing member 123 of the first fixing unit 120, thereby stably gripping the fixed tray T1. The elastic member 122 is installed in the first fixing unit 120, so that the fixed tray T1 can be elastically supported and fixed by the first and second fixing units 120 and 130.

The fixed tray T1 fixed by the first and second fixing units 120 and 130 is not inclined to the right/left side by the correcting means 140 installed in the lower portion of the main frame 110, and is horizontally maintained.

When the cylinder 222 of the gripping means 200 is driven, the ball screws 221 connected to both sides of the cylinder 222 are rotated. The plurality of gripper plates 212 become more distant from the cylinder 222, and thus the plurality of grippers 211 installed on the gripper plates 212 are opened.

The opened grippers 211 are closed by the ball screws 221 rotated in the backward direction by reverse driving of the cylinder 222, to clamp the handling tray T2 on which the electronic components are mounted.

When the handling tray T2 is sensed by the second optical sensor 320, the grippers 211 are closed. The closing operation of the grippers 211 is stopped by the first optical sensor 310.

The upper portion of the handling tray T2 is covered with the lower portion of the fixed tray T1. As a result, the electronic components mounted on the handling tray T2 can be stably disposed in the fixed positions.

In the tray transferring apparatus 100, when the handling tray T2 on which the electronic components are mounted is clamped, the handling tray T2 is moved to a predetermined position.

The tray transferring apparatus 100 can be applied to the stackers of the general handler, for precisely loading or unloading the handling tray on which the electronic components are mounted.

As discussed earlier, in accordance with the present invention, the tray transferring apparatus prevents the semiconductor devices mounted on the handling tray from being scattered or separated during the transferring operation of the handling tray, by correcting inclination of the fixed tray by the correcting means, and covering the upper portion of the handling tray with the fixed tray.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the metes and bounds of the claims, or equivalences of such metes and bounds are therefore intended to be embraced by the appended claims.

What is claimed is:

1. A tray transferring apparatus for transferring trays on which electronic components are mounted, the tray transferring apparatus comprising:
   a main frame;
   a fixing means provided on the main frame, wherein the fixing means couples a first tray to the main frame;
   a correcting means provided on the main frame, wherein the correcting means adjusts a position of the first tray relative to the mainframe;
   a gripping means provided on the main frame, wherein the gripping means grips a second tray; and
   at least one sensor provided on the main frame, wherein the at least one sensor senses at least one of an operational position of the gripping means or a presence of said second tray.

2. The apparatus of claim 1, wherein the fixing means comprises:
   a first fixing unit installed on a first side of the main frame and configured to support a first end of the first tray; and
   a second fixing unit installed on a second side of the main frame and configured to support a second end of the first tray.

3. The apparatus of claim 2, wherein the first fixing unit comprises:
   a pin attached to the main frame;
   a tension spring having a first end coupled to the pin;
   a first fixing member coupled to a second end of the tension spring and configured to elastically grip one end of the first tray, wherein a slot is formed in the first fixing member; and
   a slide member coupled to the main frame and installed in the slot of the first fixing member and configured to guide movement of the first fixing member.

4. The apparatus of claim 3, wherein a hooking jaw is formed in one end of the first fixing member, so that the first tray can be hooked and clamped thereon.

5. The apparatus of claim 3, wherein the second fixing unit comprises a second fixing member installed on a second side of the main frame and configured to support the second end of the first tray.

6. The apparatus of claim 5, wherein the second fixing member is formed in a 'ㄴ' shape.

7. The apparatus of claim 1, wherein the correcting means is installed along a central axis of the main frame.

8. The apparatus of claim 1, wherein the correcting means comprises:
   a plate installed in the upper portion of the main frame;
   a compression spring installed between a lower surface of the plate and the main frame; and
   a spacer coupled to a lower portion of the compression spring and configured to adjust a position of the first tray relative to the main frame.

9. The apparatus of claim 8, wherein the spacer limits movement of the first tray relative to the main frame.

10. The apparatus of claim 1, wherein the gripping means comprises:
    a gripping unit configured to grip the second tray;
    a driving unit configured to drive the gripping unit; and
    a guide unit configured to guide movement of the gripping unit.

11. The apparatus of claim 10, wherein the gripping unit comprises:
    a plurality of grippers disposed on opposite sides of the main frame and configured to grip the second tray; and
    a plurality of gripper plates disposed on opposite sides of the main frame, wherein the plurality of grippers are installed on the plurality of gripper plates.

12. The apparatus of claim 10, wherein the driving unit comprises:
    a ball screw configured to move the gripping unit; and
    a cylinder configured to drive the ball screw.

13. The apparatus of claim 10, wherein the guide unit comprises a rod that passes through the gripping unit, wherein the rod is configured to guide movements of the gripping unit.

14. The apparatus of claim 1, wherein the at least one sensor is an optical sensor.

15. The apparatus of claim 14, wherein the optical sensor comprises first and second optical sensors.

16. The apparatus of claim 15, wherein the first optical sensor is installed at an upper portion of the main frame and is configured to sense movement of the gripper means, and wherein the second optical sensor is installed at a side of the main frame and is configured to sense the presence of the second tray.

17. The apparatus of claim 1, wherein the correcting means is configured to bias a fixed tray against fixing members of the fixing means to thereby adjust a position of the first tray supported by the fixing means.

18. The apparatus of claim 17, wherein the correcting means comprises an elastic element mounted on the main frame and configured to press against the first tray supported by the fixing means.

19. The apparatus of claim 17, wherein the correcting means comprises first and second elastic members that are mounted, respectively, adjacent first and second ends of the main frame, and wherein the first and second elastic members are configured to press against the first tray supported by the fixing means.

20. The apparatus of claim 17, wherein the correcting means is configured to limit movement of the first tray relative to the main frame.

21. The apparatus of claim 1, wherein the fixing means is configured to hold the first tray immediately adjacent the main frame, and wherein the gripping means is configured to hold the second tray against a side of the first tray opposite the main frame.

22. The apparatus of claim 21, wherein the fixing means is configured to hold the first tray immediately adjacent a bottom surface of the main frame, and wherein the gripping means is configured to hold the second tray against a bottom surface of the first tray.

23. The apparatus of claim 1, wherein the gripping means is configured to hold the second tray against a side of the first tray opposite the main frame such that electronic components arranged in holding depressions in the second tray are prevented from escaping the holding depressions.

* * * * *